US006628524B1

United States Patent
Washino et al.

(10) Patent No.: US 6,628,524 B1
(45) Date of Patent: Sep. 30, 2003

(54) FRAME KIT FOR IC CARD AND IC CARD USING THE SAME

(75) Inventors: Kiyoshi Washino, Kanagawa (JP); Akihiro Tochi, Kanagawa (JP)

(73) Assignee: J. S. T. Mfg. Co., Ltd., Osaka (JP)

(*) Notice: Subject to any disclaimer, the term of this patent is extended or adjusted under 35 U.S.C. 154(b) by 0 days.

(21) Appl. No.: 09/543,011

(22) Filed: Apr. 4, 2000

(30) Foreign Application Priority Data

Apr. 7, 1999 (JP) .......................................... 11-100415

(51) Int. Cl.[7] ................................................ H05K 1/14
(52) U.S. Cl. ........................ 361/737; 361/736; 439/76.1
(58) Field of Search ................................. 361/736, 737, 361/759, 816, 818; 235/88 R, 492; 439/76.1

(56) References Cited

U.S. PATENT DOCUMENTS

| 5,053,613 | A | * | 10/1991 | Onoda ........................ 235/492 |
| 5,339,222 | A | * | 8/1994 | Simmons et al. ........... 361/818 |
| 5,353,201 | A | * | 10/1994 | Maeda ........................ 361/816 |
| 5,497,297 | A | * | 3/1996 | Kilmer et al. .............. 361/737 |
| 5,548,483 | A | * | 8/1996 | Feldman ..................... 361/737 |
| 5,673,181 | A |   | 9/1997 | Hsu |
| 5,879,170 | A |   | 3/1999 | Nogami |
| 5,994,769 | A | * | 11/1999 | Onoda et al. ............... 257/679 |
| 6,031,278 | A |   | 2/2000 | Onoda et al. |
| 6,151,219 | A | * | 11/2000 | Dye ........................... 361/737 |
| 6,191,950 | B1 | * | 2/2001 | Cox et al. ................... 361/737 |
| 6,313,400 | B1 | * | 11/2001 | Mosquera et al. ........ 174/35 R |

FOREIGN PATENT DOCUMENTS

| GB | 2 308 505 A | 6/1997 |
| JP | 07160837 | 6/1995 |
| JP | 10287068 | 10/1998 |

* cited by examiner

Primary Examiner—David L. Talbott
Assistant Examiner—Tuan Dinh
(74) Attorney, Agent, or Firm—Rader, Fishman & Grauer PLLC

(57) ABSTRACT

A frame kit for an IC card including a frame for defining an internal space of an IC card, a first panel integrated with the frame and having a first locking member which projects toward the internal space from an inner wall of the frame, and a second panel having a second locking member which is engageable with the first locking member of the first panel inside the frame. The first panel is integrated with the frame by simultaneous molding, for example. The second locking member is preferably composed of an elastic member.

21 Claims, 10 Drawing Sheets

FRAME KIT FOR IC CARD AND IC CARD USING THE SAME

BACKGROUND OF THE INVENTION

1. Field of the Invention

The present invention relates to a frame kit for an IC card and an IC card using the same.

2. Description of Related Art

Portable information equipment represented by a notebook personal computer, an electronic notebook, and so forth generally comprises an IC card slot on which an IC card such as a PC card or a CF card is to be mounted. The feature of the portable information equipment can be expanded by mounting the IC card on the IC card slot. The IC card has a circuit board assembly constructed by mounting a connector for connection to the IC card slot on a circuit board, a frame holding the circuit board assembly, and a pair of metal panels covering upper and lower surfaces of the circuit board assembly. The whole thereof is formed in a card shape.

An IC card fabrication system is roughly classified into a mechanical fabrication system suitable for mass production and a manual fabrication system suitable for relatively multi-kind and small-quantity production. In the mechanical fabrication system, a metal panel is fixed to a frame composed of a resin molded product, for example, using facilities such as ultrasonic welding. Contrary to this, in the manual fabrication system, a circuit board assembly and a frame are interposed between a pair of metal panels, and the metal panels are coupled by being pressed against each other with the human fingers and a jig, thereby assembling an IC card.

In a frame kit for an IC card (a frame and a pair of metal panels) for assembling by the manual fabrication system, engaging members which are locking-engaged with each other are respectively provided on sides of the pair of metal panels, for example. One of the engaging members has a claw, and the other engaging member has an engaging hole. In the case of the assembling, the engaging members are engaged with each other, and the claw is fitted in the engaging hole, so that the metal panels are coupled to each other and at the same time, the mounting of the metal panels on the frame is achieved (see JP-A-9-245143 (KOKAI), for example). The metal panels are provided so as to cover a side surface of the frame from outside, and the engaging members are locking-coupled to each other at the side surface of the frame.

In coupling the metal panels, however, the respective engaging members of the panels are elastically deformed. Accordingly, it is not necessarily easy to align the claw and the engaging hole with each other, and it is difficult to perform an operation for coupling the panels.

Moreover, the length of the claw is very small. Even if the claw and the engaging hole are completely fitted to each other at a glance, the engagement may, in some cases, be actually incomplete. If such defective products are put on the market, the IC card may be disassembled in cases where it is given a large shock, for example, a case where it is dropped on the floor.

The IC card generally has a key groove determined by a standard formed on its side end surface. For example, the CF card is provided with a long key groove leading from a front end to the vicinity of a rear end on its side surface. However, in such construction that the engaging members of the pair of metal panels cover the side surface of the frame, a key groove conforming to the standard cannot be provided on a side end surface of the frame. Consequently, it is difficult to realize a manual frame kit for a CF card.

SUMMARY OF THE INVENTION

An object of the present invention is to provide a frame kit for an IC card which can be assembled easily and reliably and an IC card using the same.

Another object of the present invention is to provide a frame kit for an IC card capable of providing a good erroneous insertion preventing key on a side surface of a frame, and an IC card using the same.

A frame kit for an IC card in the present invention comprises a frame for defining an internal space of an IC card; a first panel integrated with the frame by simultaneous molding, for example, and having a first locking member which projects toward the internal space from an inner wall of the frame; and a second panel having a second locking member which is engaged with the first locking member of the first panel inside the frame.

In the construction of the present invention, the first panel is integrated with the frame by simultaneous molding, for example. Accordingly, the amount of projection of the first locking member of the first panel from the inner wall of the frame can be defined with high precision. Further, the amount of elastic deformation of the first panel at the time of the engagement between the first and second locking members is very small. Consequently, the first locking member is hardly displaced. Accordingly, it is easy to align the first and second locking members with each other at the time of the engagement, and it is possible to engage the first locking member and the second locking member easily and reliably.

It is preferable that one of the first locking member and the second locking member has a locking claw, and the other locking member has an engaging hole with which the locking claw is engaged. It is more preferable that the second locking member is composed of an elastic member. In this case, the locking claw is introduced into the engaging hole mainly by the elastic deformation of the second locking member, so that the first and second locking members are snap-coupled to each other. Since the first locking member is hardly deformed at the time of the snap coupling, the locking claw can be fitted in the engaging hole easily and reliably. The locking claw which has been completely fitted in the engaging hole once does not easily slip off the engaging hole. Accordingly, the IC card may not be disassembled after being assembled.

In the construction of the present invention, when the first and second panels are pressed against each other, the first locking member and the second locking member are engaged with each other inside the frame. Therefore, the first and second panels need not be provided so as to surround the outside of the frame. Accordingly, an outer side surface of the frame can be exposed. If the present invention is applied to an IC card such as a CF card which must be provided with a key groove for preventing erroneous insertion from a front end to the vicinity of a rear end of its side surface, therefore, a good key groove can be provided in the frame. Consequently, it is possible to provide a good manual frame kit for a CF card.

In such construction that a metal panel covers an outer surface of a frame, an end surface of the panel is exposed. Accordingly, the appearance of an IC card is not necessarily desirable. Moreover, the end surface of the panel must be prevented from forming a sharp edge by being subjected to finish processing. In the construction of the present invention in which the paired panels are engaged with each other inside the frame, edges of the panels can be contained in the frame or in an internal space of the frame. Accordingly, the appearance of the IC card is improved, and end surfaces of the panels need not be subjected to finish processing.

Furthermore, one of the panels and the frame are integrated with each other by the simultaneous molding, for example. Accordingly, the amount of deformation of the frame is significantly smaller, as compared with that in a case where the panels and the frame are individual components to be assembled. Therefore, the IC card has good durability against an external force. Further, the first panel and the frame can be handled as one component, so that the number of components can be reduced. This also makes it easier to assemble the IC card.

It is preferable that the first locking member is implanted in the frame, and is held in the frame with its front end projected toward the internal space from the inner wall of the frame.

In this construction, the first locking member is hardly deformed because it is implanted in the frame. Therefore, it is easier to align and engage the first locking member and the second locking member with each other.

It is preferable that the frame has an outer surface exposed toward the outside of the IC card to form a side surface in the direction in which the IC card is inserted. It is preferable that an erroneous insertion preventing key for preventing the IC card from being inserted in a wrong posture into an IC card slot is formed on the outer surface of the frame, and the first panel is integrated with the frame in a state where an area where the erroneous insertion preventing key is formed is ensured, that is, a state where the area is avoided.

In this construction, the outer surface of the frame is exposed as a side surface of the IC card after the IC card is assembled, and the erroneous insertion preventing key is provided on the outer surface of the frame.

In the present invention, it is possible for the panel not to cover the outer surface of the frame. Therefore, the present invention is applied to an IC card (for example, a CF card) conforming to a standard which requires the erroneous insertion preventing key to be provided extending from a front end to the vicinity of a rear end on a side surface of the card, therefore, it is possible to provide a manual frame kit conforming to such a standard.

It is preferable that the second panel has a positioning member (for example, an elastic positioning member) which is abutted against the inner wall of the frame for positioning the second panel elastically, for example, with respect to the frame.

In this construction, the second panel is positioned with respect to the frame by abutting the positioning member against the inner wall of the frame elastically, for example. That is, the elastic positioning member is abutted against the frame, for example, to press the frame outward. The second panel is pressed toward the center of the frame by its reaction. Accordingly, it is possible to reliably arrange the second panel in a regular position, and it is possible to reliably prevent displacement after the assembling.

It is preferable that the elastic positioning member is provided integrally with the second panel. It is more preferable that the elastic positioning members are provided on both sides of the second panel. Further, the positioning elastic member may be projected toward the inner wall of the frame from the second locking member.

An IC card according to the present invention comprises the frame kit having the above-mentioned features and a circuit board assembly constructed by mounting the connector on the circuit board, and is constructed by containing the circuit board assembly between the first panel and the second panel.

In this construction, the panels can be easily coupled to each other by the engagement between the first and second locking members. Moreover, the panels can be reliably coupled to the frame. Therefore, the IC card may not be disassembled.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In an embodiment described below, description is made of a case where the present invention is applied to a CF card. However, the present invention is also applicable to an IC card conforming to another standard, for example, a PC card or a small PC card.

Figure 1:
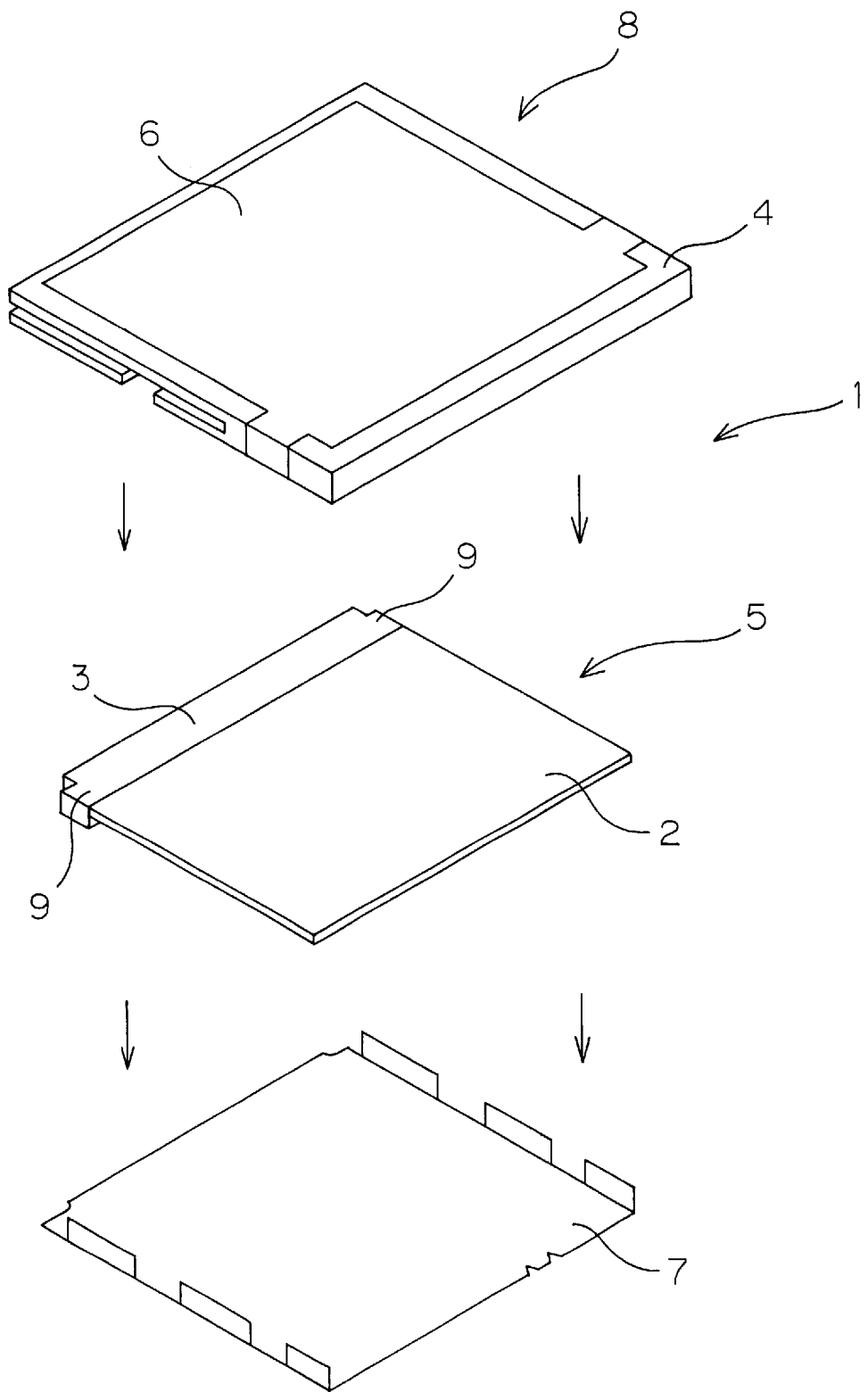
FIG. 1 is an exploded perspective view of a CF card according to an embodiment of the present invention.

FIG. 1 an exploded perspective view showing the construction of a CF card 1 according to an embodiment of the present invention. Referring to FIG. 1, the CF card 1 comprises a circuit board assembly 5, a frame 4 for defining an internal space of the CF card 1 and holding the, circuit board assembly 5, a first panel 6 for covering an upper surface of the circuit board assembly 5, and a second panel 7 for covering a lower surface of the circuit board assembly 5. The circuit board assembly 5 has a printed circuit board 2 and a connector 3 attached to a front end of the printed circuit board 2. The first panel 6 is positioned above the printed circuit board 2 in a state where the CF card 1 is normally used. The frame 4 and the first panel 6 are integrated with each other by simultaneous molding, thereby constituting a frame panel assembly 8.

The connector 3 is used for the electrical connection between a CF card slot (not shown) and the printed circuit board 2, and comprises a pair of first projections 9 in its side parts. Description is now made by taking the side of the connector 3 connected to the CF card slot as the front.

The connector 3 has a plurality of contacts (not shown) projecting backward. The contacts are soldered to the bottom surface of the printed circuit board 2. The mounting of the connector 3 on the printed circuit board 2 is achieved by the soldering.

Figure 2:
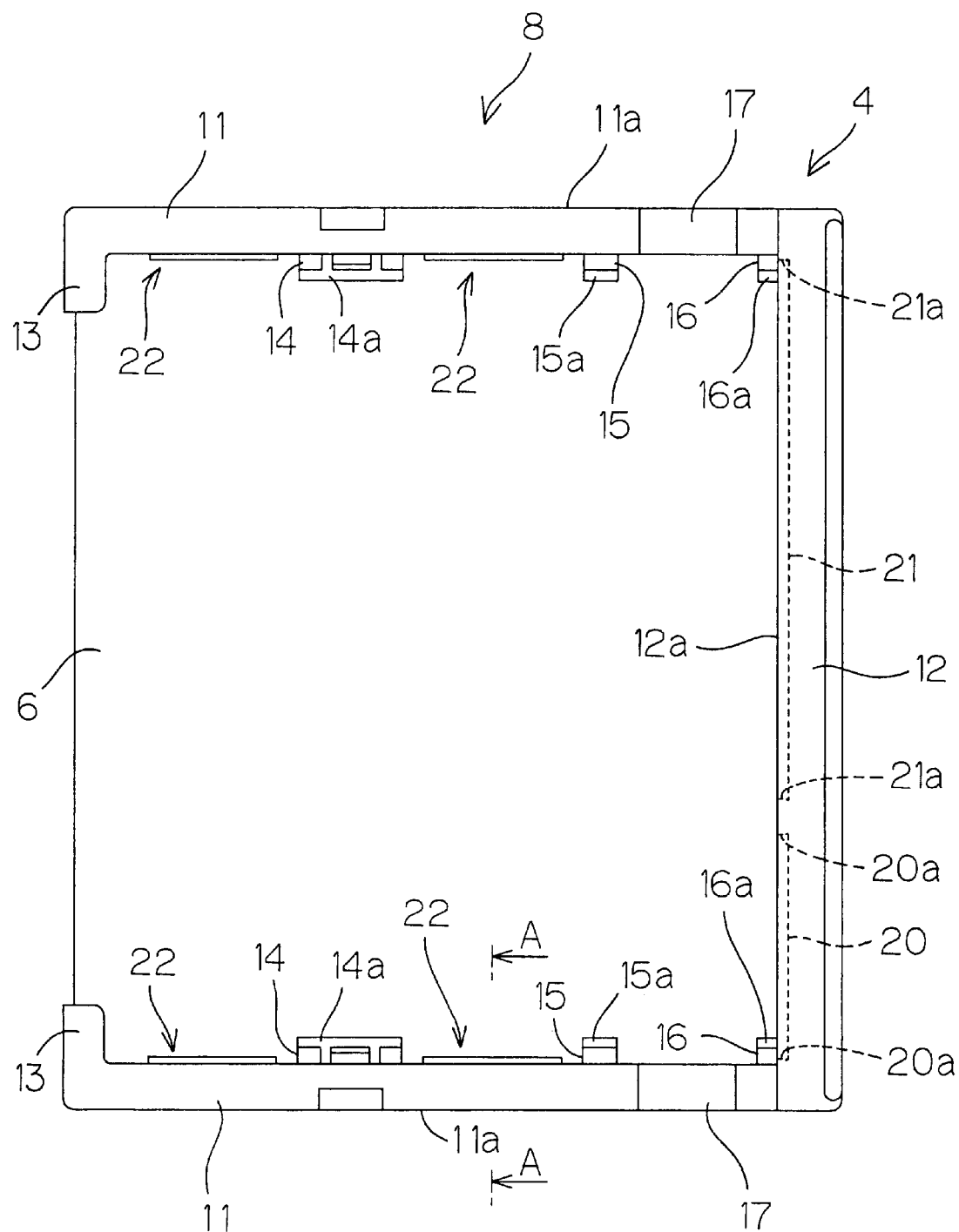
FIG. 2 is a bottom view of a frame panel assembly.

FIG. 2 is a bottom view of the frame panel assembly 8. The frame panel assembly 8 is obtained by integrating the first panel 6 composed of a conductive plate in an approximately rectangular shape with the frame 4 by simultaneous molding. For example, it is formed by injection molding the frame 4 on the first panel 6.

The frame 4 has an approximately U shape, and defines an internal space of the CF card in its inner part. The frame 4 comprises a pair of opposite side beams 11 and a rear end beam 12 for connecting respective rear ends of the side beams 11.

An engaging projection 13 projecting inward is formed at a front end of each of the side beams 11. The paired engaging projections 13 are respectively engaged with the first projections 9 of the connector 3 to hold the connector 3 in containing the circuit board assembly 5 in the frame panel assembly 8.

A second projection 14 projecting inward is provided in a position near the front of each of the side beams 11 a little beyond the center thereof. Further, a third projection 15 is provided in a position near the rear of each of the side beams 11 a little beyond the center thereof. A fourth projection 16 is provided at a rear end of each of the side beams 11. Engaging portions 14a, 15a, and 16a for holding the printed circuit board 2 are respectively formed on upper surfaces of the second, third, and fourth projections 14, 15, and 16. A conductive portion 17 is provided in the vicinity of the rear end of each of the side beams 11. The conductive portion 17 is obtained by winding a metal member extending downward from the first panel 6 around the side beam 11.

Figure 3:
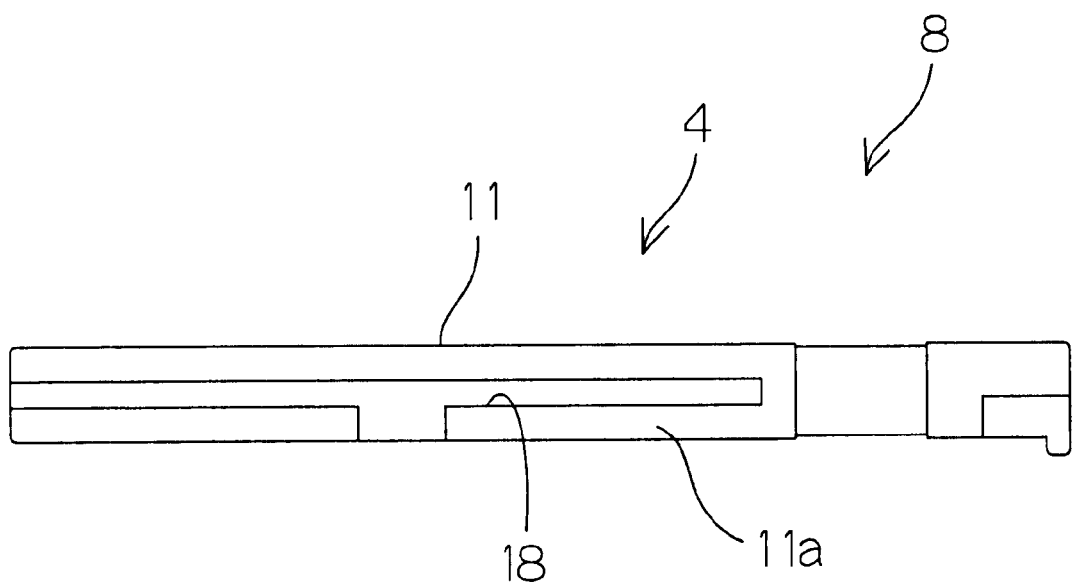
FIG. 3 is a diagram showing the shape of a side surface of the frame panel assembly.

FIG. 3 is a diagram showing the shape of a side surface of the frame panel assembly 8. An outer side surface 11a of the side beam 11 is exposed outward, to form a side surface of the CF card 1. An erroneous insertion preventing key 18 for preventing the CF card 1 from being inserted in a wrong posture into the CF card slot is formed on the outer side surface 11a. The erroneous insertion preventing key 18 extends from a front end of the side beam 11 in the frame 4 to a position near the rear of the side beam 11 a little beyond the center thereof. The width of the erroneous insertion preventing key 18 differs between the right and left outer side surfaces 11a. Consequently, the CF card 1 is prevented from being inserted into the CF card slot (not shown) in a wrong posture, for example, such a posture that it is turned upside down. Further, the erroneous insertion preventing key 18 is closed at the rear of the CF card 1. Accordingly, the CF card 1 cannot be also inserted into the CF card slot with it being laterally inverted.

Referring to FIG. 2 again, the rear end beam 12 has a pair of grooves 20 and 21 extending along the length of the rear end beam 12 on its inner wall 12a. The grooves 20 and 21 respectively have pairs of positioning abutting portions 20a and 21a at both their ends.

First locking members 22 are provided in two portions spaced apart from each other in each of the side beams 11 in the frame 4.

Figure 4:
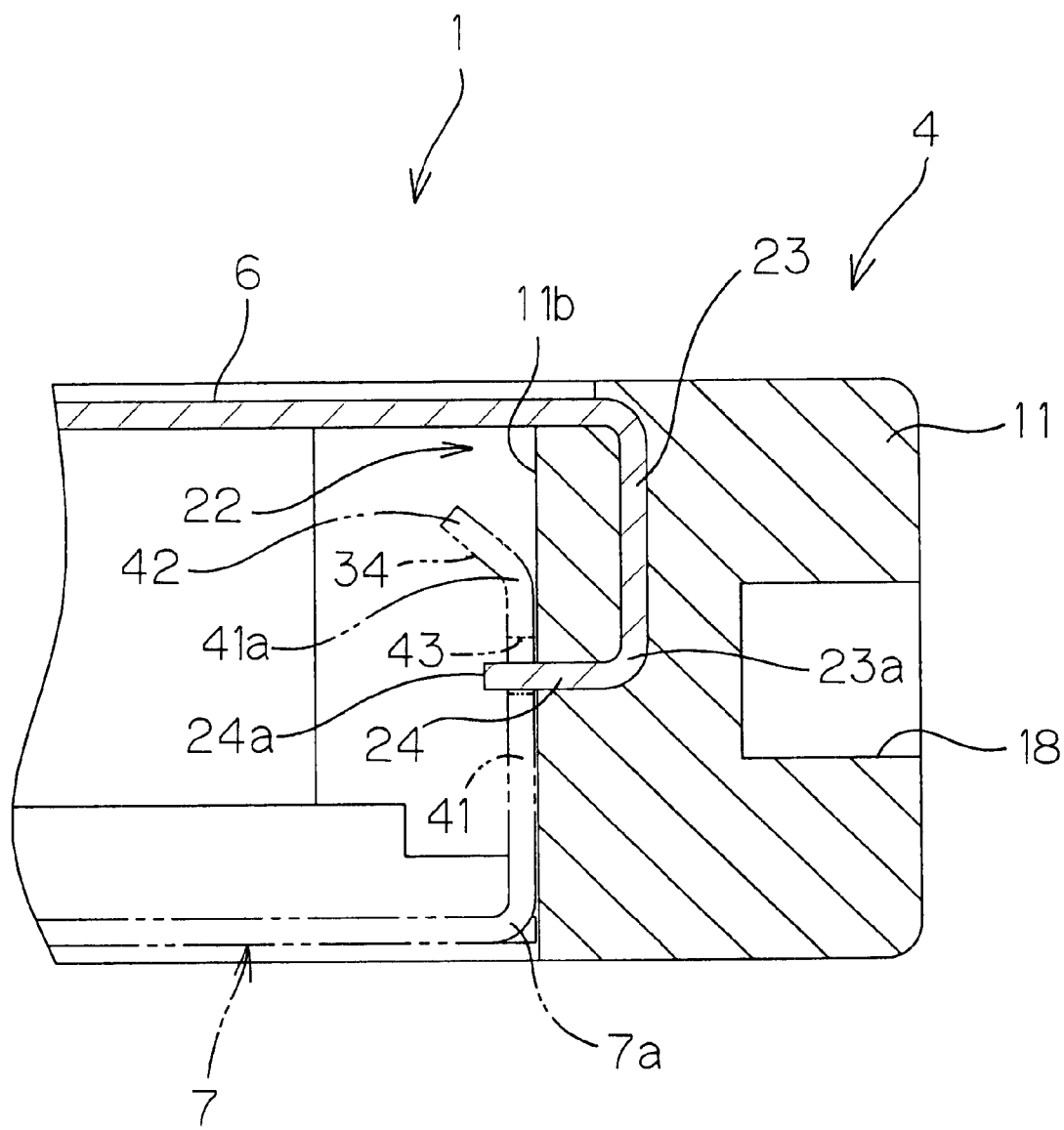
FIG. 4 is a cross-sectional view taken along a line A—A shown in FIG. 2.

FIG. 4 is a cross-sectional view taken along a line A—A shown in FIG. 2. FIG. 4 illustrates the CF card 1 in the direction in which it is normally used.

The first locking member 22 comprises a hanging portion 23 hanging toward the inside of the CF card 1 from a side edge of the first panel 6 and entering the side beam 11 and a locking claw 24 folded inward from a front edge 23a of the hanging portion 23. The first locking member 22 is thus implanted in the side beam 11 in the frame 4. A front end 24a of the locking claw 24 projects toward an internal space of the CF card 1 almost perpendicularly from an inner wall 11b of the side beam 11. Since the first panel 6 and the frame 4 are integrated with each other by simultaneous molding, the amount of projection of the locking claw 24 from the inner wall 11b is defined with high precision.

When the frame panel assembly 8 and the second panel 7 are coupled to each other, the first locking member 22 is engaged with a second locking member 34 provided in the second panel 7 inside the frame 4, so that both the panels 6 and 7 are coupled to each other.

As indicated by a two-dot and dash line in FIG. 4, the second locking member 34 comprises a raised portion 41 bent upward (toward the inside of the CF card) and molded along the inner wall 11b of the side beam 11 in the frame 4 from a side 7a of the second panel 7, a guiding portion 42 extending obliquely toward the inside of the frame 4 from a front end 41a of the raised portion 41 for guiding the locking claw 24, and an engaging hole 43 formed in the raised portion 41, to constitute an elastic member as a whole.

Figure 5A:
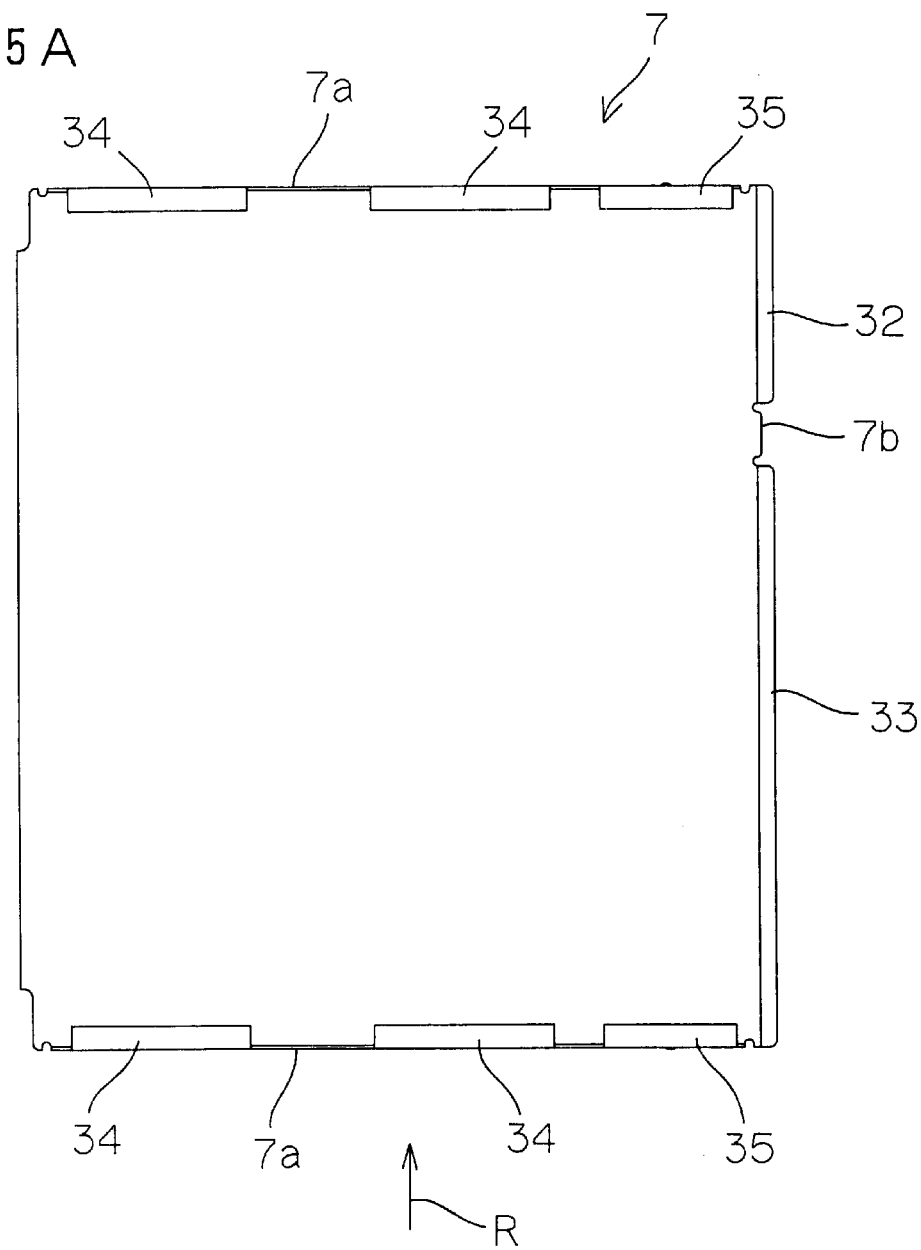
FIGS. 5A and 5B are diagrams for explaining the construction of a second panel.
Figure 5B:
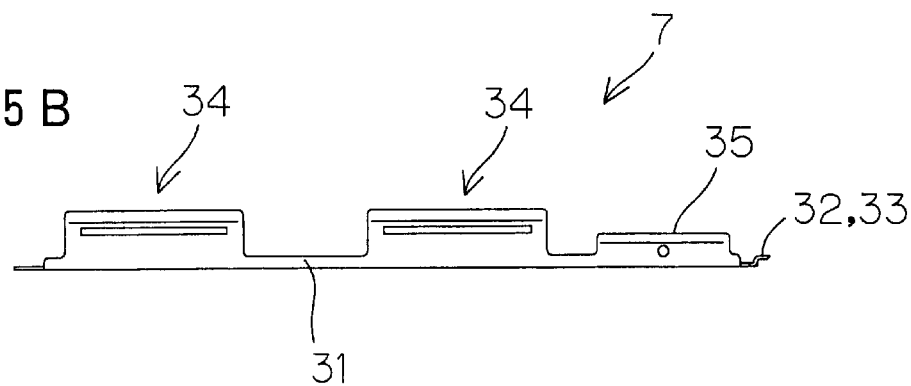

FIG. 5A is a plan view showing the construction of the second panel 7, and FIG. 5B is a side view of the second panel 7 as viewed from a direction indicated by an arrow R in FIG. 5A.

The second panel 7 is a plate-shaped member in an approximately rectangular shape composed of a conductive plate. The second panel 7 has a folded member 31 folded upward (toward the inside of the CF card 1) from both the sides 7a over nearly the full lengths of the sides 7a.

The second panel 7 comprises a pair of rotating and engaging members 32 and 33 on its rear end side 7b. The paired rotating and engaging members 32 and 33 respectively have predetermined widths along the rear end side 7b, and are in shapes respectively aligned with a pair of grooves 20 and 21 formed in the frame 4.

Second locking members 34 are respectively formed in two portions spaced apart from each other on each of the sides 7a. Further, a conductive member 35 extending upward is provided in the vicinity of the rear end of each of the sides 7a.

The procedure for assembling the CF card 1 will be described.

Figure 6:
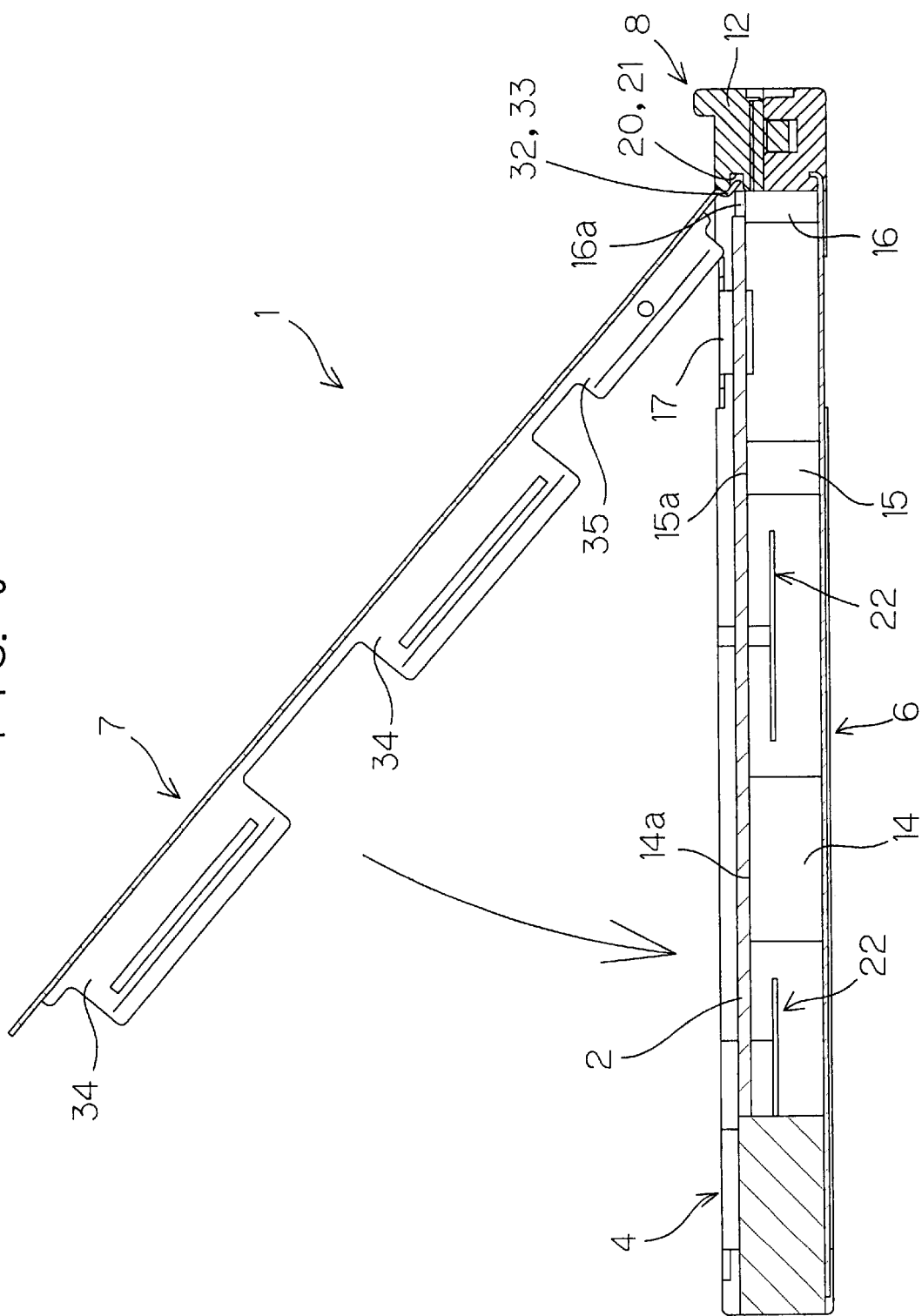
FIG. 6 is a cross-sectional view of a CF card for explaining assembling.

Referring to FIG. 6, the printed circuit board 2 is fitted in the engaging portions 14a, 15a, and 16a of the second, third, and fourth projections 14, 15, and 16 in a state where the frame panel assembly 8 is turned over, so that the circuit board assembly 5 is held in the frame 4.

Thereafter, the paired rotating and engaging members 32 and 33 in the second panel 7 are respectively engaged with the grooves 20 and 21 formed in the rear end beam 12 in the frame 4 with the frame panel assembly 8 held with one of worker's hands and with the second panel 7 obliquely applied to the frame panel assembly 8 with the other hand.

The worker presses the second panel 7 against the frame 4 in such a manner that the first and second panels 6 and 7 are pressed against each other with the fingers of both the hands. Consequently, the first locking member 22 and the second locking member 34 are snap-coupled to each other, so that the first and second panels 7 and 8 are locking-coupled to each other.

At this time, the first locking member 22 and the second locking member 34 are coupled to each other inside the frame 4, so that the outer side surface 11a of the side beam 11 is exposed. Accordingly, the erroneous insertion preventing key 18 is not covered with the panels 6 and 7.

In a state where the first and second panels 6 and 7 and the frame 4 are coupled to each other, the conductive member 35 formed in the second panel 7 is abutted against the conductive portion 17 in the opposite first panel 6, thereby obtaining stable electrical conduction between both the panels 6 and 7.

Figure 7A:
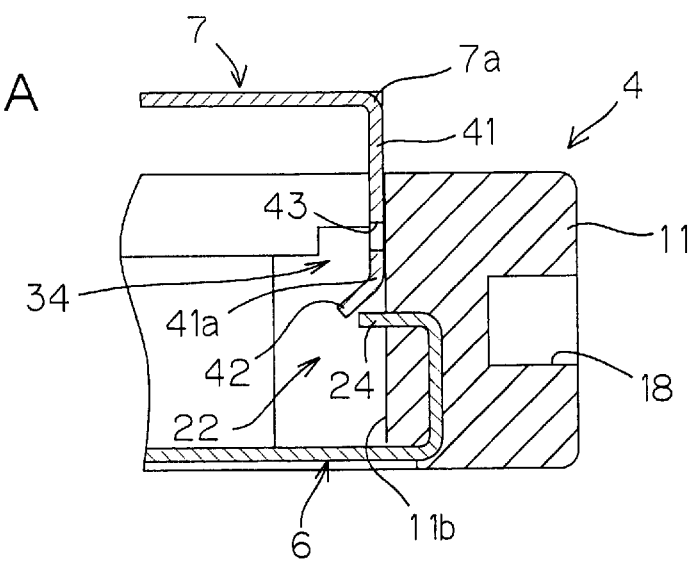
FIGS. 7A to 7C are cross-sectional views of a principal part for graphically showing how a first locking member and a second locking member are engaged with each other.
Figure 7B:
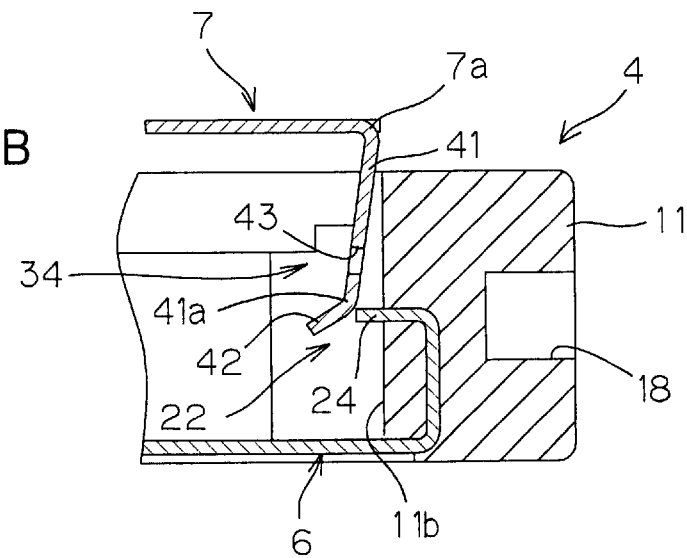
Figure 7C:
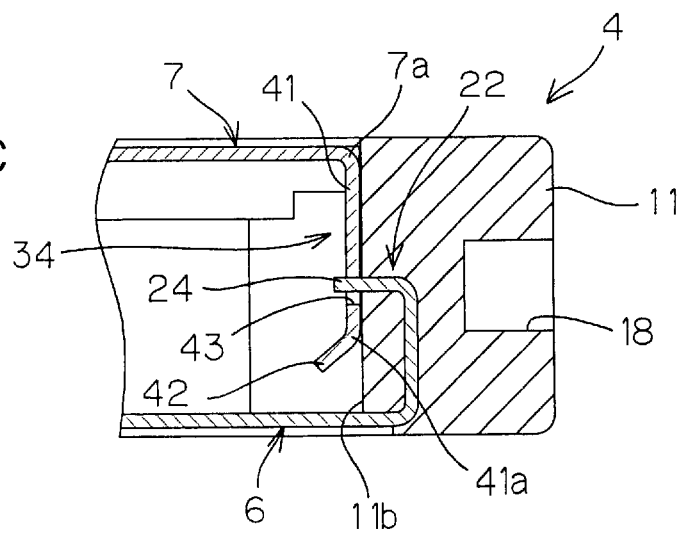

FIGS. 7A to 7C are cross-sectional views of a principal part for graphically showing how the first locking member 22 and the second locking member 34 are engaged with each other. If the first panel 6 and the second panel 7 are pressed against each other from the state shown in FIG. 7A, the guiding portion 42 guides the corresponding locking claw 24 to the engaging hole 43, as shown in FIG. 7B. At this time, an area in the vicinity of the raised portion 41 and the guiding portion 42 in the second panel 7 are elastically deformed toward the inside of the frame 4. On the other hand, the first locking member 22 which is implanted in the side beam 11 is hardly deformed. Therefore, the first and second locking members 22 and 34 can be aligned with each other with high precision. Thereafter, when the locking claw 24 extending inward is contained in the engaging hole 43, as shown in FIG. 7C, the raised portion 41 and the guiding portion 42 in the first panel 6 which are elastically deformed inward are respectively restored into their original shapes. The first and second locking members 22 and 34 are aligned with each with high precision, and the first locking member 22 is hardly deformed. Accordingly, both the first and second locking members 22 and 34 can be engaged with each other easily and reliably.

The raised portion 41 and the guiding portion 42 are thus elastically deformed, and the locking claw 24 and the engaging hole 43 are snap-engaged with each other when the elastic deformation is restored. Accordingly, both the raised portion 41 and the guiding portion 42 are deeply engaged with each other, to enter a locked state. If the first and second locking members 22 and 34 are engaged with each other once, therefore, the CF card 1 is not disassembled.

When the second panel 7 is pressed against the frame panel assembly 8, a sound in the snap coupling between the locking members 22 and 34 is emitted, thereby creating a good feeling at the time of coupling both the panels 6 and 7.

The folded member 31 is provided over nearly the whole areas of both the sides 7a of the second panel 7. After the CF card 1 is assembled, therefore, the end surface of the second panel 7 is not exposed, thereby producing a good appearance.

As described in the foregoing, according to the present embodiment, the first panel 6 is integrated with the frame 4 by simultaneous molding. Accordingly, the amount of projection of the first locking member 22 in the first panel 6 from the inner wall 11b of the frame 4 can be defined with high precision. Further, the amount of elastic deformation of the first panel 6 at the time of the engagement between the first and second locking members 22 and 34 is very small. Consequently, the first locking member 22 is hardly displaced. Accordingly, it is easy to align the first and second locking members 22 and 34 with each other at the time of the engagement. Further, it is possible to engage the first locking member 22 and the second locking member 34 with each other easily and reliably.

When the first and second panels 6 and 7 are pressed against each other, the first locking member 22 and the second locking member 34 are engaged with each other inside the frame 4. Accordingly, the outer side surface 11a of the frame 4 can be exposed. Consequently, a good erroneous insertion preventing key 18 can be provided in the frame 4.

Furthermore, the first panel 6 and the frame 4 are integrated with each other. Accordingly, the amount of deformation of the frame 4 is significantly smaller, as compared with that in a case where the panel 6 and the frame 4 are individual components to be assembled. Therefore, the CF card 1 can have good durability against an external force. Further, the first panel 6 and the frame 4 can be substantially handled as one component, so that the number of components can be reduced. Consequently, the CF card 1 can be assembled more easily.

Figure 8A:
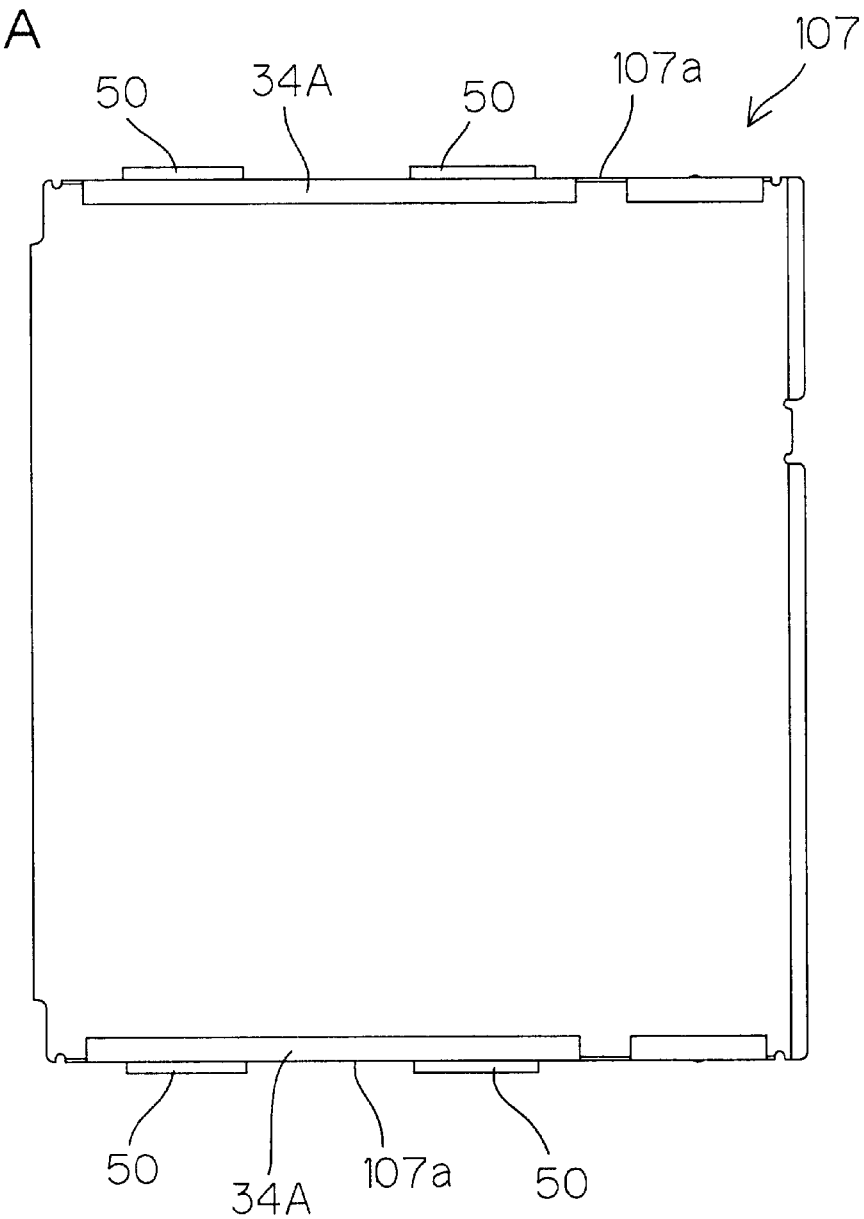
FIGS. 8A and 8B are diagrams for explaining a second panel according to another embodiment of the present invention.
Figure 8B:
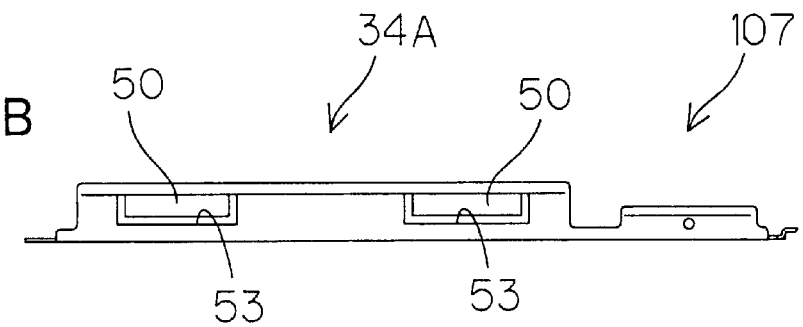

FIGS. 8A and 8B are diagrams for explaining the construction of a second panel 107 in another embodiment in a CF card according to the present invention. The second panel 107 is used in place of the second panel 7 in the embodiment shown in FIG. 1. The second panel 107 in the present embodiment differs from the second panel 7 shown in FIGS. 5A and 5B in that there are provided elastic positioning members 50 for positioning the second panel 107 with respect to a frame 4.

In the embodiment shown in FIGS. 8A and 8B, a second locking member 34A is formed extending from a front end of each of sides 107a of the second panel 107 to a position near a rear end of the side 107a a little beyond the center thereof.

The second locking member 34A comprises two engaging holes 53. The engaging holes 53 are respectively fitted in locking claws 24 of a first locking member 22 which are provided at corresponding positions, to couple both panels 6 and 107.

Figure 9:
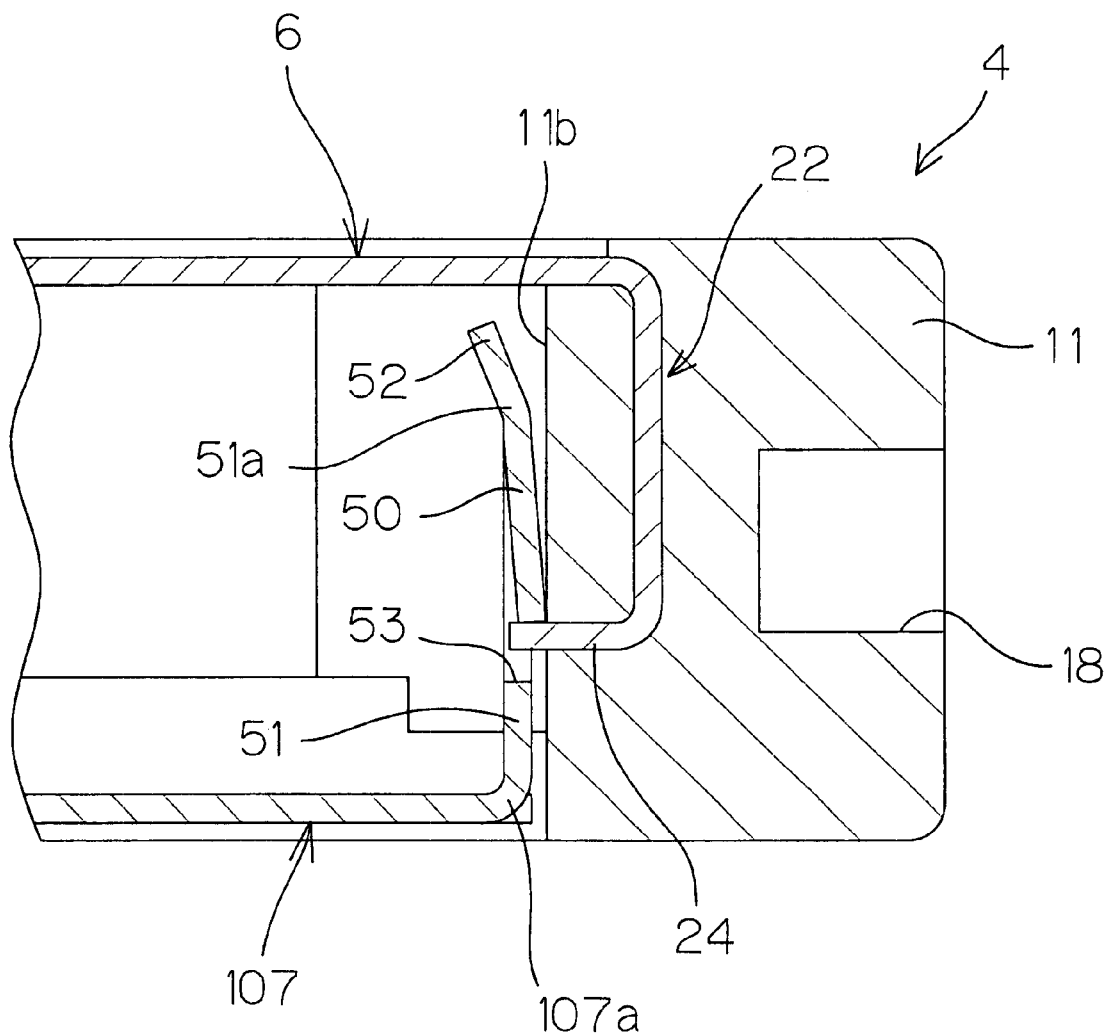
FIG. 9 is a cross-sectional view of a principal part of a CF card according to the embodiment shown in FIGS. 8A and 8B.

When the second panel 107 and the first panel 6 are coupled to each other in the present embodiment, the second locking member 34A is engaged with the first locking member 22. Referring to FIG. 9, the second locking member 34A comprises a raised portion 51 bent upward (toward the inside of the CF card 1) and formed along an inner wall 11b of a side beam 11 in a frame 4 from the slide 107a of the second panel 107, a guiding portion 52 extending obliquely toward the inside of the frame 4 from a front end 51a of the raised portion 51 for guiding the locking claw 24, two engaging holes 53 formed in the raised portion 51, and upward elastic positioning members 50 formed by raising upper parts of the engaging holes 53 outward (toward the inner wall 11b of the frame 4) from the front end 51a of the raised portion 51, constitute an elastic member as a whole.

Figure 10A:
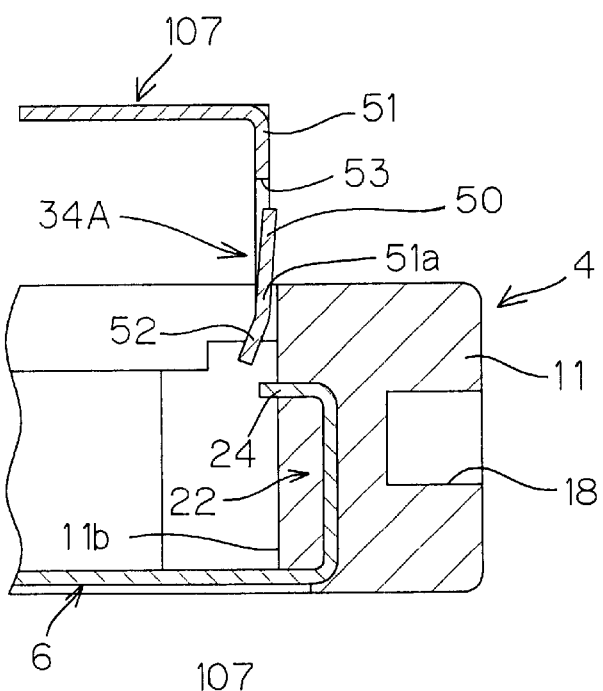
FIGS. 10A to 10C are cross-sectional views of a principal part for graphically showing how a second locking member and a first locking member are engaged with each other in the embodiment shown in FIGS. 8A and 8B.
Figure 10B:
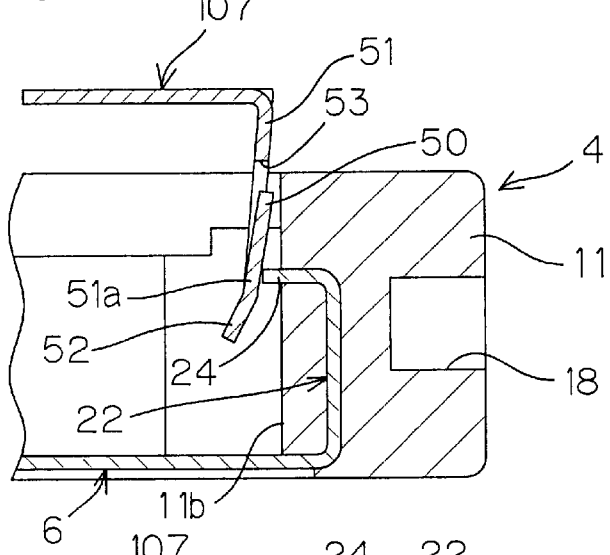
Figure 10C:
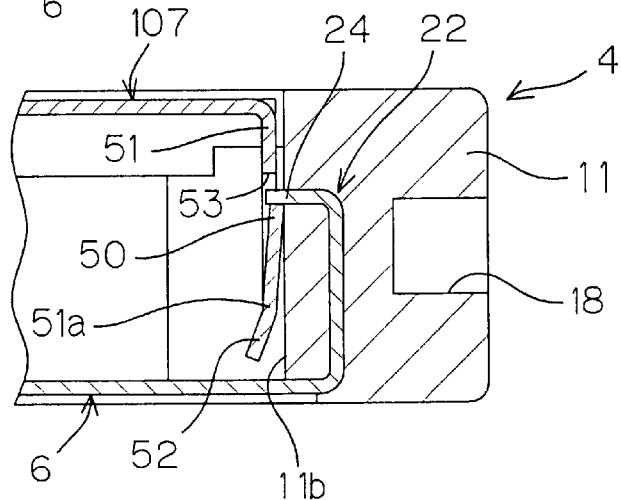

FIGS. 10A to 10C are cross-sectional views of a principal part for graphically showing how the first locking member 22 and the second locking member 34A are engaged with each other.

As shown in FIG. 10A, the first panel 6 and the second panel 107 are pressed against each other.

When the panels 6 and 7 are locked to each other, the guiding portion 52 guides the corresponding locking claw 24 to the engaging hole 53, as shown in FIG. 10B. At this time, an area in the vicinity of the raised portion 51 and the guiding portion 52 in the second panel 6 are elastically deformed toward the inside of the frame 4. Thereafter, when the locking claw 24 extending inward is contained in the engaging hole 53, as shown in FIG. 10C, the raised portion 51 and the guiding portion 52 in the first panel 6 which are elastically deformed inward are restored to their original shapes. At this time, the elastic positioning members 50 are abutted against the frame 4, to press the frame 4 outward.

The elastic positioning members 50 are elastically, abutted against the inner wall 11b of the frame 4, so that the second panel 107 is positioned with respect to the frame 4. That is, the elastic positioning members 50 are abutted against the frame 4, to press the frame 4 outward. The second panel 107 is pressed toward the center of the frame 4 by its reaction. Accordingly, it is possible to reliably arrange the second panel 107 at a regular position, and it is possible to reliably prevent displacement after the assembling.

Although the present invention has been described and illustrated in detail, it is clearly understood that the same is by way of illustration and example only and is not to be taken by way of limitation, the spirit and scope of the present invention being limited only by the terms of the appended claims.

The present invention claims the conventional priority benefits of Japanese Patent Application No. 11-100415 filed with the Japanese Patent Office on Apr. 7, 1999, the disclosure of which is incorporated hereinto by reference.

What is claimed is:

1. A frame kit for an IC card, comprising:
   a generally U-shaped frame fabricated from an injection molding material and having an inner wall defining an internal space;
   a first panel fabricated from metal material and including a L-shaped locking member having a hanging portion and a locking claw portion with the hanging portion and a rear segment of the locking claw portion fixedly and immovably embedded and held in the frame to connect the first panel to the frame, where a front segment of the locking claw portion projects out from the inner wall and into the internal space; and
   a second panel fabricated from metal material and having an engaging locking member having an engaging hole which is engageable with the front segment of the locking claw portion to connect the second panel to the frame.

2. The frame kit according to claim 1, wherein
   the first panel is integrated with the frame by simultaneous molding.

3. The frame kit according to claim 1, wherein
   the engaging locking member is formed as an integral construction with the second panel, moves angularly relative thereto in a resiliently biased manner from a position perpendicular to the second panel.

4. The frame kit according to claim 1, wherein
   edges of the first panel and the second panel are contained in the frame or in an internal space of the frame.

5. The frame kit according to claim 1, wherein
   the frame has an outer surface exposed toward an outside of the IC card to form a side surface in a direction in which the IC card is inserted.

6. The frame kit according to claim 1, wherein
   the second panel has a positioning member which is abutted against the inner wall of the frame for positioning the second panel with respect to the frame.

7. The frame kit according to claim 1, wherein the engaging locking member includes a guiding portion disposed forwardly of said engaging hole, the guiding portion extends obliquely toward the internal space to guide said engaging hole towards the front segment of the locking claw portion.

8. The frame kit according to claim 5, wherein
   an erroneous insertion preventing key for preventing the IC card from being inserted in a wrong posture into an IC card slot is formed on the outer surface of the frame, and
   the first panel is integrated with the frame in a state where an area where the erroneous insertion preventing key is formed is ensured.

9. The frame kit according to claim 6, wherein
   the positioning member is an elastic positioning member which is elastically abutted against the inner wall of the frame.

10. The frame kit according to claim 8, wherein said erroneous insertion key has a width that differs along an outer surface of the frame.

11. An IC card comprising:
    a frame fabricated from an injection molding material and having an inner wall defining an internal space of the IC card;
    a first panel fabricated from metal material and having a L-shaped locking member having a hanging portion and a locking claw portion forming the L-shape with the hanging portion and a rear segment of the locking claw portion being fixedly and immovably embedded and held in the frame to connect the first panel to the frame with a front segment of the locking claw portion projecting into the internal space from the inner wall of the frame;
    a second panel fabricated from metal material and having an engaging locking member having an engaging hole which is engageable with the front segment of the locking claw portion inside the frame, said engaging locking member comprising a guiding portion that extends obliquely toward the internal space; and
    a circuit board assembly constructed by mounting a connector on the circuit board, the circuit board assembly being contained between the first panel and the second panel.

12. The IC card according to claim 11, wherein
    the first panel is integrated with the frame by simultaneous molding.

13. The IC card according to claim 11, wherein
    the engaging locking member is formed as an integral construction with the second panel, moves angularly relative thereto in a resiliently biased manner from a position perpendicular to the second panel.

14. The IC card according to claim 11, wherein
    edges of the first panel and the second panel are contained in the frame or in an internal space of the frame.

15. The IC card according to claim 11, wherein
    the frame has an outer surface exposed toward an outside of the IC card to form a side surface in a direction in which the IC card is inserted.

16. The IC card according to claim 11, wherein
    the second panel has a positioning member which is abutted against the inner wall of the frame for positioning the second panel with respect to the frame.

17. The IC card according to claim 11, wherein the engaging locking member includes a guiding portion disposed forwardly of said engaging hole, and guides said engaging hole towards said front segment of the locking claw portion.

18. The IC card according to claim 15, wherein an erroneous insertion preventing key for preventing the IC card from being inserted in a wrong posture into an IC card slot is formed on the outer surface of the frame, and the first panel is integrated with the frame in a state where an area where the erroneous insertion preventing key is formed is ensured.

19. The IC card according to claim 16, wherein the positioning member is an elastic positioning member which is elastically abutted against the inner wall of the frame.

20. The IC card according to claim 18, wherein said erroneous insertion key has a width that differs along an outer surface of the frame.

21. A frame kit for an IC card, comprising:

a generally U-shaped frame fabricated from an injection molding material and having an inner wall defining an internal space confined within the frame;

a first panel fabricated from metal material and including a L-shaped locking member having a hanging portion and a locking claw portion with the hanging portion and a rear segment of the locking claw portion connected to the hanging portion being integrally molded with the frame such that the first panel is connected to the frame as a result of the hanging portion and the rear segment being fixedly and immovably embedded into and thereby held in the frame, wherein a front segment of the locking claw portion connected to and extending from the rear segment projects out from the inner wall and into the internal space; and a second panel fabricated from metal material and having an engaging locking member having an engaging hole which is engageable with the front segment of the locking claw portion to connect the second panel to the frame such that, when the engaging locking member and the engaging hole are engaged, the engaging hole receives that front segment and the engaging locking member surrounds the front segment of the looking claw portion and facially contacts the inner wall of the frame.

* * * * *